US009698090B2

(12) United States Patent
Fang et al.

(10) Patent No.: US 9,698,090 B2
(45) Date of Patent: Jul. 4, 2017

(54) SEMICONDUCTOR SUBSTRATE AND FABRICATION METHOD THEREOF

(71) Applicant: Siliconware Precision Industries Co., Ltd., Taichung (TW)

(72) Inventors: Bo-Shiang Fang, Taichung (TW); Ho-Chuan Lin, Taichung (TW); Chia-Chu Lai, Taichung (TW); Min-Han Chuang, Taichung (TW); Li-Fang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/753,882

(22) Filed: Jan. 30, 2013

(65) Prior Publication Data

US 2014/0124950 A1 May 8, 2014

(30) Foreign Application Priority Data

Nov. 2, 2012 (TW) ............................ 101140676 A

(51) Int. Cl.

*H01L 23/48* (2006.01)
*H01L 23/498* (2006.01)
*H01L 23/14* (2006.01)
*H01L 23/13* (2006.01)
*H01L 21/768* (2006.01)

(52) U.S. Cl.

CPC .. *H01L 23/49827* (2013.01); *H01L 21/76898* (2013.01); *H01L 23/13* (2013.01); *H01L 23/147* (2013.01); *H01L 23/49822* (2013.01); *H01L 23/49894* (2013.01); *H01L 23/49816* (2013.01); *H01L 2224/11* (2013.01); *H01L 2924/0002* (2013.01); *H01L 2924/19011* (2013.01)

(58) Field of Classification Search

CPC .................................................. H01L 23/5384
USPC ......... 257/734–738, 686, 773–774, 777–778
See application file for complete search history.

(56) References Cited

U.S. PATENT DOCUMENTS

2009/0115017 A1* 5/2009 Chang ............... H01L 21/76224 257/510
2009/0302480 A1* 12/2009 Birner et al. ................ 257/774
2010/0178761 A1* 7/2010 Chen ................ H01L 21/76898 438/613
2011/0031581 A1* 2/2011 West .................... H01L 23/481 257/508
2011/0254160 A1* 10/2011 Tsai et al. ..................... 257/738
2011/0291287 A1* 12/2011 Wu et al. ...................... 257/774
(Continued)

*Primary Examiner* — Cuong Q Nguyen
*Assistant Examiner* — Nishath Yasmeen
(74) *Attorney, Agent, or Firm* — Mintz Levin Cohn Ferris Glovsky and Popeo, P.C.; Peter F. Corless; Steven M. Jensen

(57) ABSTRACT

A semiconductor substrate is disclosed. The semiconductor substrate includes a substrate body having at least an opening formed on a surface thereof, wherein the surface of the substrate body and a wall of the opening are made of an insulating material; and a circuit layer formed on the surface of the substrate body, wherein the circuit layer covers an end of the opening and is electrically insulated from the opening. The opening facilitates to increase the thickness of the insulating structure between the circuit layer and the substrate body of a silicon material to prevent signal degradation when high frequency signals are applied to the circuit layer.

8 Claims, 3 Drawing Sheets

26 250 22a 22c 2 25 24 22b 21 20 201 23 23

(56) References Cited

U.S. PATENT DOCUMENTS

2012/0007210 A1 * 1/2012 Shih .................. H01L 21/76224
257/506

* cited by examiner

FIG.2C"

SEMICONDUCTOR SUBSTRATE AND FABRICATION METHOD THEREOF

CROSS-REFERENCES TO RELATED APPLICATIONS

This application claims under 35 U.S.C. §119(a) the benefit of Taiwanese Application No. 101140676, filed Nov. 2, 2012, the entire contents of which is incorporated herein by reference.

BACKGROUND OF THE INVENTION

1. Field of the Invention

The present invention relates to semiconductor substrates, and more particularly, to a semiconductor substrate and a fabrication method thereof for preventing distortion of high frequency signals.

2. Description of Related Art

Along with the rapid development of electronic industries, electronic products are developed towards miniaturization, high electrical performance, high functionality and high speed. Accordingly, three-dimensional chip stack technologies have been developed, which generally involve RDL (redistribution layer) structures, TSV (through silicon via) structures, etc. for forming electrical connection structures for signal transmission so as to increase operation speeds and bandwidths of chip stack structures.

FIGS. 1A to 1C are schematic cross-sectional views showing a fabrication method of a conventional semiconductor substrate 1.

Referring to FIG. 1A, a silicon-containing substrate body 10 having a plurality of through holes 100 formed therein is provided. The substrate body 10 is further heated in an oxygen environment so as to cause upper and lower surfaces of the substrate body 10 and walls of the through holes 100 to be made of an insulating material 11 of silicon dioxide.

Referring to FIG. 1B, a metal material is filled in the through holes 100 to form TSVs 13, and a circuit layer 12 is formed on the upper surface of the substrate body 10 and electrically connected to the TSVs 13. Therein, portions of the circuit layer 12 can serve as integrated passive devices (not shown).

Referring to FIG. 1C, an RDL structure 14 is formed on the upper surface of the substrate body 10, the circuit layer 12 and the TSVs 13. Further, an insulating layer 15 is formed on the RDL structure 14 and a plurality of openings 150 are formed in the insulating layer 15 so as for a plurality of conductive elements 16 to be formed in the openings 150.

The insulating material 11 of silicon dioxide is formed by heating the substrate body 10 in a high temperature and high pressure environment for a certain time duration. Generally, a thin insulating material is formed with a short heating time so as to reduce the fabrication cost. As such, referring to FIG. 1B, the distance between the circuit layer 12 and the substrate body 10, i.e., the thickness t of the insulating material 11, becomes very small, thus easily resulting in signal degradation when high frequency signals are applied to the circuit layer 12.

On the other hand, in order to increase the thickness of the insulating material 11 so as to overcome the above-described drawback, both the heating time and the concentration of oxygen need to be increased, thereby greatly increasing the fabrication cost.

Therefore, there is a need to provide a semiconductor substrate and a fabrication method thereof so as to overcome the above-described drawbacks.

SUMMARY OF THE INVENTION

In view of the above-described drawbacks, the present invention provides a semiconductor substrate, which comprises a substrate body having at least an opening formed on a surface thereof, wherein the surface of the substrate body and a wall of the opening are made of an insulating material; and a circuit layer formed on the surface of the substrate body, wherein the circuit layer covers an end of the opening and is electrically insulated from the opening.

The present invention further provides a fabrication method of a semiconductor substrate, which comprises the steps of providing a substrate body having at least an opening formed on a surface thereof, wherein the surface of the substrate body and a wall of the opening are made of an insulating material; and forming a circuit layer on the surface of the substrate body, wherein the circuit layer covers an end of the opening and is electrically insulated from the opening.

In the above-described semiconductor substrate and fabrication method thereof, the substrate body can be a silicon-containing substrate. The substrate body can be heated in an oxygen environment so as to form silicon dioxide as the insulating material. The substrate body can further have a conductive through hole formed therein and electrically connected to the circuit layer.

In the above-described semiconductor substrate and fabrication method thereof, the opening can be of a hollow shape. Alternatively, before the circuit layer is formed, the opening can be filled with an insulating material.

In an embodiment, an RDL (redistribution layer) structure is further formed on the surface of the substrate body and the circuit layer and electrically connected to the circuit layer. The substrate body further has a at least conductive through hole formed therein and electrically connected to the RDL structure. Furthermore, a plurality of conductive elements are formed on the RDL structure.

According to the present invention, the opening of the substrate body facilitates to increase the thickness of the insulating structure between the circuit layer and the substrate body of a silicon material so as to prevent signal degradation and distortion when high frequency signals are applied to the circuit layer.

Further, even if the insulating material has a small thickness, the formation of the opening causes the insulating structure between the circuit layer and the substrate body to have a thickness enough to prevent signal degradation. Therefore, an ultra-thin insulating material can be formed with a greatly reduced heating time and a greatly reduced concentration of oxygen, thereby greatly reducing the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "upper", "lower", "a" etc. are only used as a matter of descriptive convenience and not intended to have any other significance or provide limitations for the present invention.

FIGS. 2A to 2E are schematic cross-sectional views showing a fabrication method of a semiconductor substrate 2*a*, 2 according to an embodiment of the present invention.

Figure 1A:
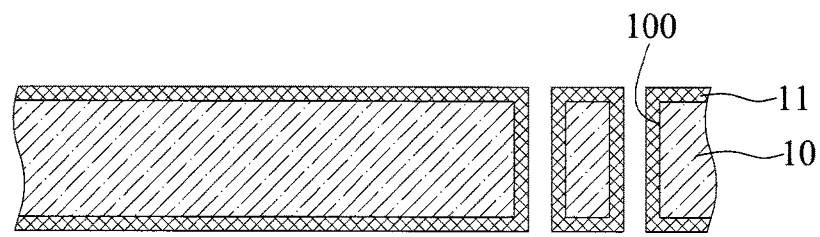
FIGS. 1A to 1C are schematic cross-sectional views showing a fabrication method of a conventional semiconductor substrate.
Figure 1B:
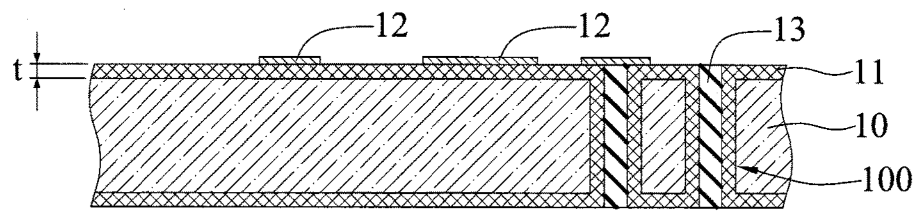
Figure 1C:
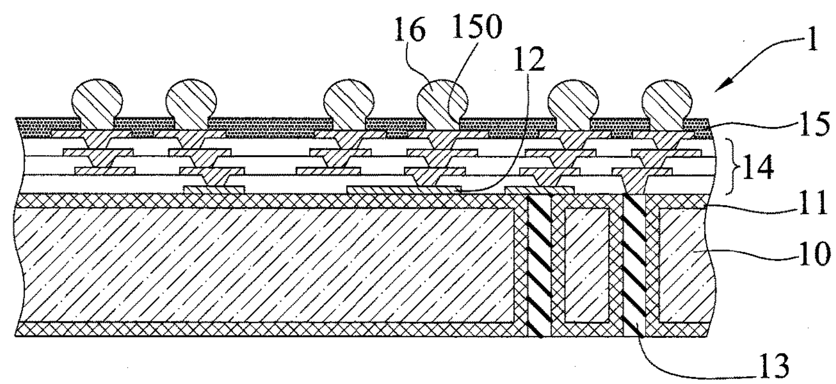
Figure 2A:
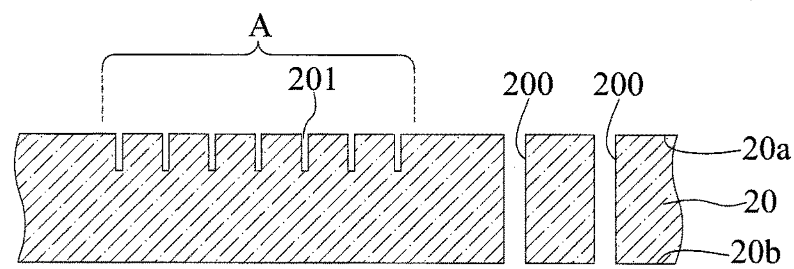
FIGS. 2A to 2E are schematic cross-sectional views showing a fabrication method of a semiconductor substrate according to an embodiment of the present invention, wherein FIG. 2C' is a plan view showing a partial top surface of the semiconductor substrate of FIG. 2C, and FIG. 2C" shows another embodiment of FIG. 2C.

Referring to FIG. 2A, a substrate body 20 having a first surface 20*a* and a second surface 20*b* opposing to the first surface 20*a* is provided. An open area A is defined on the first surface 20*a* of the substrate body 20, and a plurality of openings 201 are formed in the open area A on the first surface 20*a* of the substrate body 20, but do not penetrate through the substrate body 20 to the second surface 20*b*. Furthermore, a plurality of through holes 200 are formed outside the open area A and penetrating the first surface 20*a* and the second surface 20*b* of the substrate body 20.

The substrate body 20 can be a silicon-containing substrate such as a wafer or an interposer.

Figure 2B:
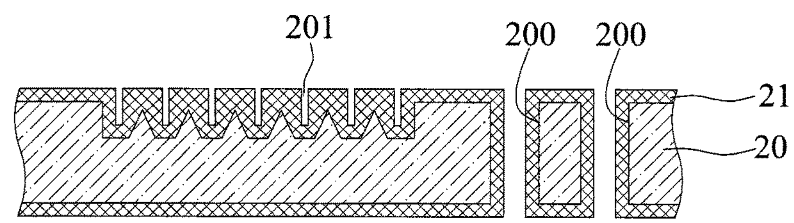

Referring to FIG. 2B, the substrate body 20 is heated in an oxygen environment such that the first surface 20*a* and the second surface 20*b* of the substrate body 20 and walls of the openings 201 and the conductive through holes 200 are oxidized into an insulating material 21. Thus, the first surface 20*a* and the second surface 20*b* of the substrate body 20, the walls of the openings 201 and the conductive through holes 200 are made of the insulating material 21.

In the present embodiment, the insulating material 21 is, but not limited to, silicon dioxide.

Figure 2C:
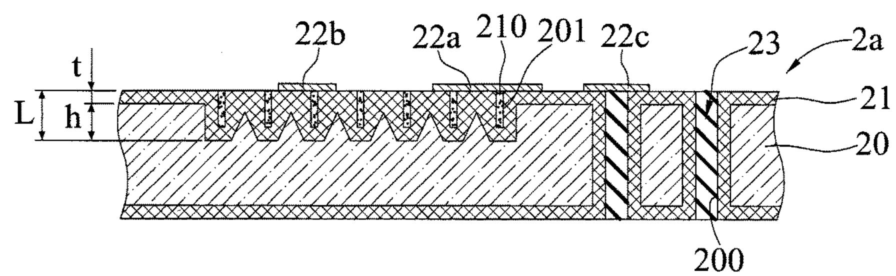
Figure 2C:
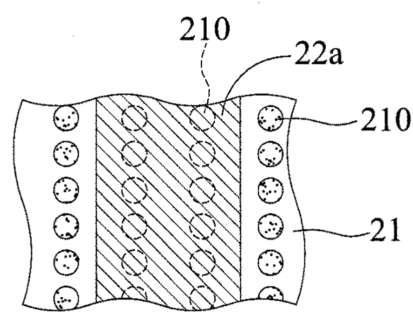

Referring to FIGS. 2C and 2C', a filling material 210 is filled in the openings 201. Then, a metal material is filled in the through holes 200 to form conductive through holes 23, such as through silicon vias (TSVs), and a circuit layer 22*a*, 22*b*, 22*c* is formed on the insulating material 21 of the first surface 20*a* of the substrate body 20. The portions of the circuit layer 22*a*, 22*b* cover one ends of the openings 201 and are electrically insulated from the openings 201, and another portion of the circuit layer 22*c* is located on the conductive through holes 23 and electrically connected to the conductive through holes 23.

In the present embodiment, the circuit layer portion 22*a* serves as a general conductive path and the circuit layer portion 22*b* serves as an integrated passive device.

The circuit layer 22*a*, 22*b*, 22*c* and the conductive through holes 23 can be made of copper. The filling material 210 can be an insulating material, such as benzocyclobutene (BCB).

In another embodiment, referring to FIG. 2C", each of the openings 201 has a hollow shape, and the circuit layer portions 22*a*, 22*b* cover one ends of the openings 201 and are electrically insulated from the openings 201.

According to the present invention, the openings 201 having a depth h facilitate to increase the thickness L of the insulating structure between the circuit layer 22*a*, 22*b* and the silicon material at the bottom of the openings 201 of the substrate body 20. That is, the thickness L of the insulating structure is equal to the thickness t of the insulating material 21 plus the depth h of the openings 201. Therefore, the present invention prevents signal degradation and distortion when high frequency signals are applied to the circuit layer 22*a*, 22*b*.

Therefore, even if the insulating material 21 has a very small thickness, the formation of the openings 201 causes the insulating structure between the circuit layer 22*a*, 22*b* and the substrate body 20 to have a thickness enough to prevent signal degradation. Therefore, an ultra-thin insulating material 21 can be formed with a significantly reduced heating time and a significantly reduced concentration of oxygen so as to significantly reduce the fabrication cost.

In other embodiments, the openings 201 can penetrate the substrate body 20 to the second surface 20*b* as long as the circuit layer portions 22*a*, 22*b* are electrically insulated from the openings 201.

Figure 2D:
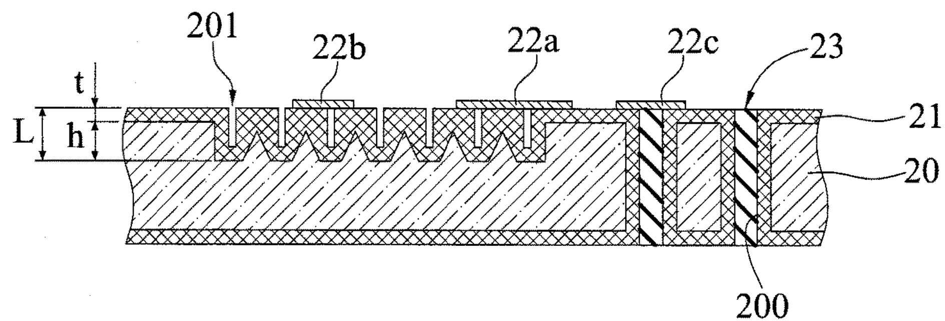
Figure 2D:
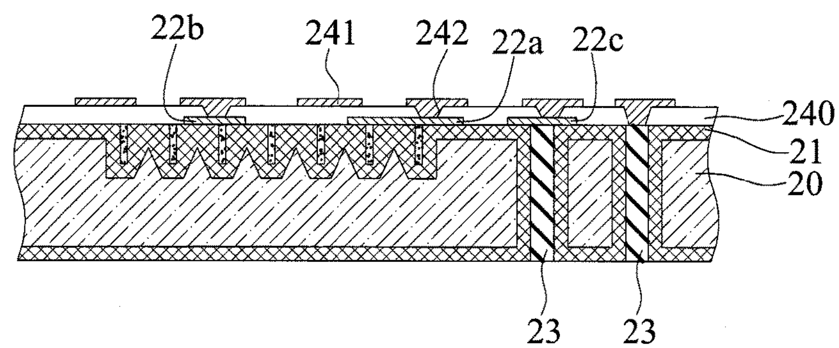
Figure 2E:
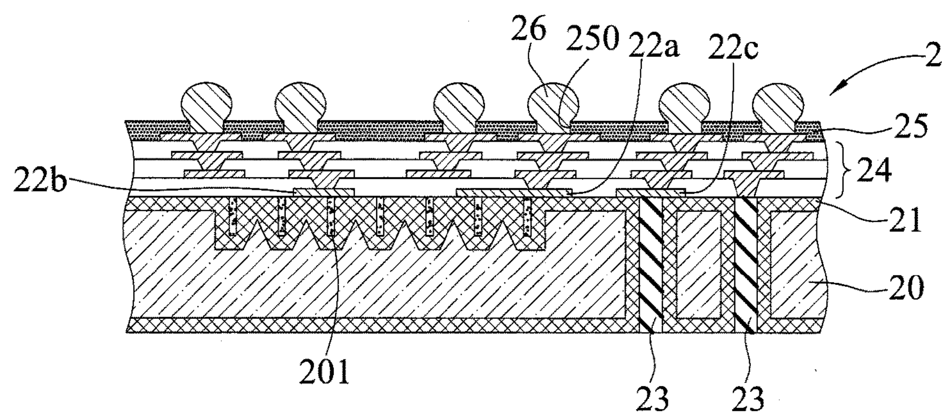

Referring to FIGS. 2D and 2E, an RDL structure 24 is formed on the insulating material 21 of the first surface 20*a* and the circuit layer 22*a*, 22*b*, 22*c*, and a plurality of conductive elements 26 are formed on the RDL structure 24.

In the present embodiment, the RDL structure 24 has at least a dielectric layer 240, i.e., a passivation layer, at least a circuit layer 241 formed on the dielectric layer 240, and a plurality of conductive vias 242 formed in the dielectric layer 240 for electrically connecting the circuit layer 241 to the circuit layer 22*a*, 22*b*, 22*c* and the conductive through holes 23. An insulating layer 25 is further formed on the outermost dielectric layer 240 and a plurality of openings 250 are formed in the insulating layer 25 such that portions of the circuit layer 241 are exposed from the openings 250 so as for the conductive elements 26 to be formed thereon.

The conductive elements 26 can be metal bumps or copper pillars for bonding with an electronic device such as a packaging substrate (not shown).

Therefore, a semiconductor substrate 2*a*, 2 is obtained by the above-described method. The semiconductor substrate 2*a*, 2 includes a substrate body 20 having a plurality of openings 201 formed on a surface thereof, wherein the surface of the substrate body 20 and walls of the openings 201 are made of an insulating material 21; and a circuit layer 22*a*, 22*b*, 22*c* formed on the surface of the substrate body 20, wherein portions of the circuit layer 22*a*, 22*b* cover one ends of the openings 201 and are electrically insulated from the openings 201.

The semiconductor substrate 20 is a silicon-containing substrate, and further has a plurality of conductive through holes 23 electrically connected to a portion of the circuit layer 22*c*. The openings 201 have a hollow shape or are filled with an insulating material such as a filling material 210.

The insulating material 21 is made of silicon dioxide and is further formed on walls of the conductive through holes 23.

In an embodiment, the semiconductor substrate 2 further has an RDL structure 24 formed on the insulating material 21 of the first surface 20*a* of the substrate body 20 and the circuit layer 22*a*, 22*b*, 22*c* and electrically connected to the circuit layer 22*a*, 22*b*, 22*c* and the conductive through holes 23, and a plurality of conductive elements 26 formed on the RDL structure 24.

Therefore, by forming openings in the substrate body, the present invention increases the thickness of the insulating structure between the circuit layer and the substrate body of a silicon material through the depth of the openings so as to prevent signal degradation and distortion when high frequency signals are applied to the circuit layer.

Further, even if the insulating material has a small thickness, the formation of the openings causes the insulating structure between the circuit layer and the substrate body to have a thickness enough to prevent signal degradation. Therefore, an ultra-thin insulating material can be formed with a greatly reduced heating time and a greatly reduced concentration of oxygen, thereby greatly reducing the fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor substrate, comprising:

a substrate body having at least an opening formed on a surface thereof without penetrating through the substrate body, wherein the surface of the substrate body and a wall of the opening are made of an insulating material, the opening is filled with a filling material, and the insulating material and the filling material are made of different materials; and a first circuit layer formed on and being in direct contact with the surface of the substrate body and an end of the opening, wherein the first circuit layer directly covers a portion of the surface of the substrate body and the end of the opening, and the first circuit layer is electrically insulated from the opening.

2. The substrate of claim 1, wherein the substrate body is a silicon-containing substrate.

3. The substrate of claim 1, further comprising at least a conductive through hole formed in the substrate body and electrically connected to a second circuit layer, wherein the second circuit layer is formed on the surface of the substrate body.

4. The substrate of claim 1, wherein the insulating material is silicon dioxide.

5. The substrate of claim 1, wherein the opening is of a hollow shape.

6. The substrate of claim 1, further comprising a redistribution layer (RDL) structure formed on the surface of the substrate body and the first circuit layer and electrically connected to the first circuit layer.

7. The substrate of claim 6, further comprising at least a conductive through hole formed in the substrate body and electrically connected to the RDL structure.

8. The substrate of claim 6, further comprising a plurality of conductive elements formed on the RDL structure.

* * * * *